United States Patent [19]

Beinvogl et al.

[11] 4,380,489

[45] Apr. 19, 1983

[54] METHOD OF PRODUCING POLYSILICON STRUCTURE IN THE 1 μM RANGE ON SUBSTRATES CONTAINING INTEGRATED SEMICONDUCTOR CIRCUITS BY PLASMA ETCHING

[75] Inventors: Willy Beinvogl, Munich; Barbara Hasler, Stockdorf, both of Fed. Rep. of Germany

[73] Assignee: Siemens Aktiengesellschaft, Berlin & Munich, Fed. Rep. of Germany

[21] Appl. No.: 341,485

[22] Filed: Jan. 21, 1982

[30] Foreign Application Priority Data

Jan. 30, 1981 [DE] Fed. Rep. of Germany ....... 3103177

[51] Int. Cl.$^3$ .......................................... H01L 21/306
[52] U.S. Cl. .................................. 156/643; 156/646; 156/657; 156/659.1; 156/345; 204/192 E; 252/79.1
[58] Field of Search ................... 204/164, 192 E, 298; 156/643, 646, 657, 659.1, 662, 345; 252/79.1; 427/38, 39

[56] References Cited

U.S. PATENT DOCUMENTS 4,208,241  6/1980  Harshbarger et al. ......... 156/656 X
4,214,946  7/1980  Forget et al. .................. 156/646 X

OTHER PUBLICATIONS

H. Mader, "Anisotropic Plasma Etching of Polysilicon with CF$_4$", *ECS Spring Meeting* (1980) pp. 274–276.
C. J. Mogob et al., "Anisotropic Plasma Etching of Polysilicon", *J. Voc. Sci. Technol.*, vol. 17 (May/Jun. 1980), pp. 721–730.
R. A. Gdula, "SF$_6$ RIE of Polysilicon", *ECS Fall Meeting* (1979) pp. 1524–1526.
N. Endo et al., "1 μm MOS Process Using Inisotropic Dry Etching", *IEEE Trans-Actions on Electron Devices*, vol. ED-27 (Aug., 1980) pp. 1346–1351.

*Primary Examiner*—William A. Powell
*Attorney, Agent, or Firm*—Hill, Van Santen, Steadman, Chiara & Simpson

[57] ABSTRACT

Polysilicon structures down to a 1 μm range on substrates containing integrated semiconductor circuits are produced by plasma etching in a plate reactor with the use of SF$_6$ and an inert gas as the reactive gas. During this process, a semiconductor crystal wafers (4, 17) covered with a SiO$_2$ layer (16) and a polysilicon layer (15) is provided with an etch mask (14) and positioned on a grounded electrode of the plate reactor and an etching process, which achieves a high selectivity of polysilicon (15) to SiO$_2$ (16) and to the etch mask (14), is carried out with a HF power, P, of <0.1 watt/cm$^2$, a gas pressure, p, ranging from 60 to 120 Pa, and an electrode temperature ranging from 20° to 60° C. With the inventive process, large scale integrated semiconductor circuits are produced in a single stage sequence with high etching selectivity, uniform etching and a high throughput of silicon wafers.

6 Claims, 4 Drawing Figures

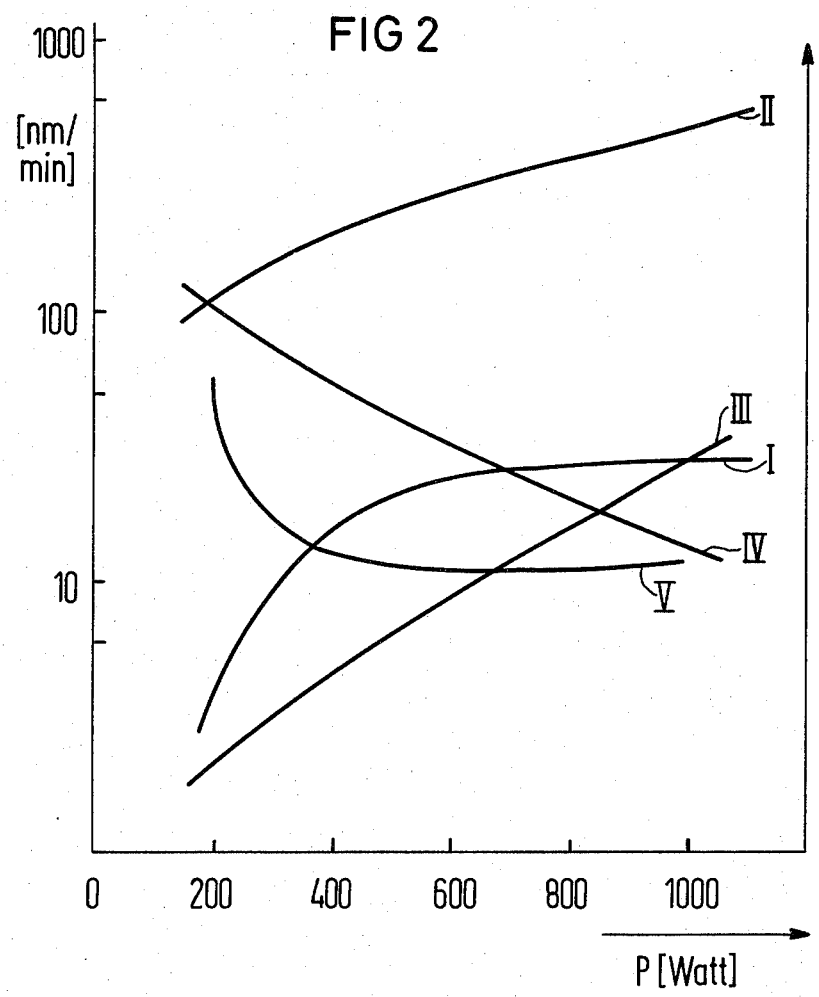

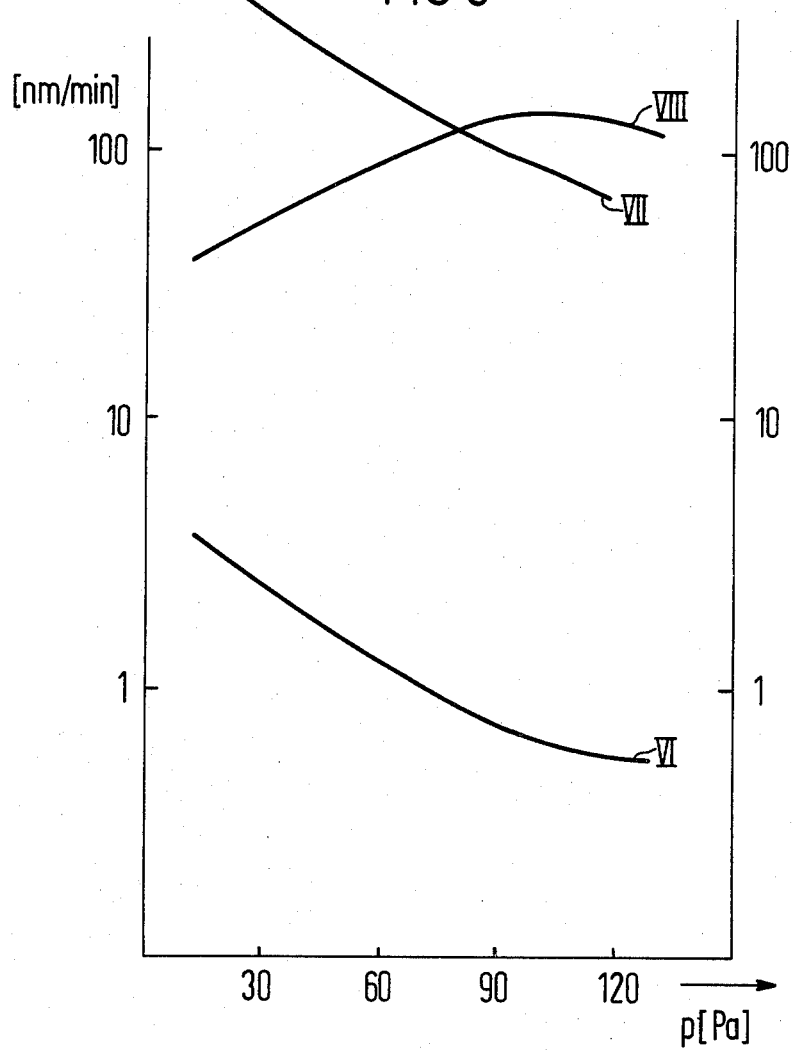

METHOD OF PRODUCING POLYSILICON STRUCTURE IN THE 1 μM RANGE ON SUBSTRATES CONTAINING INTEGRATED SEMICONDUCTOR CIRCUITS BY PLASMA ETCHING

BACKGROUND OF THE INVENTION

1. Field of the Invention

The invention relates to methods of producing polysilicon structures and somewhat more particularly to producing polysilicon structures in the 1 μm range on substrates containing integrated semiconductor circuits by plasma etching in a large plate reactor with a reactive gas mixture.

2. Prior Art

Reactive dry etching techniques are primarily utilized at present for producing structures in polysilicon layers during fabrication of large scale integrated semiconductor circuits. With polysilicon layers, such dry etching techniques are frequently practiced in tunnel reactors with reactive gas mixtures consisting of carbon tetrafluoride, ($CF_4$), and oxygen. A disadvantage of this technique is the occurrence of under-cutting, as with wet-etching (chemical etching), as well as a non-uniform etching reaction. Therefore, workers utilized plate reactors, instead of tunnel reactors, for dry etching. Tunnel reactors continues to be used in uncritical process steps, i.e., for production of large structures or where surface-wide etching is desired.

With the use of plate reactors, two etching techniques are possible:

1. A plasma etching in which substrates to be etched are positioned on grounded electrodes and $CF_4$ or fluorine-chlorine mixed gases are utilized in the reactive gas with gas pressure ranging from 50 to 150 Pa. This type of etching is, for example, described in an article by H. Mader, *ECS Spring Meeting*, (1980) pages 274–276 or in an article by C. J. Mogab et al., *J. Vac. Sci. Technol.*, Vol. 17, No. 3, (May/June 1980), pages 721–730.

2. A reactive sputter etching or ion etching in which substrates to be etched are positioned on HF—conductive electrodes and sulfur hexafluoride, ($SF_6$), is utilized as a reaction gas with nitrogen or helium as a carrier gas. This type of etching is, for example, described in an article by R. A. Gdula, *ECS Fall Meeting*, (1979) pages 1524–1526 or in an article by N. Endo et al., *IEEE Transactions On Electron Devices*, Vol. ED-27, No. 8, (August 1980), pages 1346–1351.

The foregoing etching techniques are disadvantageous because they produce too low of a uniformity in the etching reaction (corrosion), have a too low of a selectivity for the materials being etched or they create high under-cuttings so that their use in large plate reactors suitable for fabrication of integrated semiconductor circuits is not possible.

SUMMARY OF THE INVENTION

The invention provides a dry etching technique useful for production of relatively fine-sized polysilicon structures down to a 1 μm range in large scale integrated semiconductor circuits which, in a single stage process sequence, achieves a high etching selectivity, a good uniformity in etching reaction and all the while allowing a high throughput of silicon wafers, i.e. allowing a good work load of the reactor.

In accordance with the principles of the invention, polysilicon structures down to a 1 μm range on substrates containing integrated semiconductor circuits are produced by plasma etching in a plate reactor with a reactive gas mixture comprised of sulfur hexafluoride and an inert gas whereby a substrate to be etched and containing a polysilicon layer and an etch mask is positioned on a ground electrode of the plate reactor while regulating the reactor parameters so that the high frequency power (P) is less than 0.1 watts/$cm^2$, the gas pressure (p) of the reactive gas in the reactor is adjusted to a value in the range of 60 through 120 Pa, and the electrode temperature (T) is adjusted to a value in the range of 20° through 60° C.

By utilizing extremely low HF—power (in a typical case, the power is higher by a factor of about 10), preferably in the range of about 0.03 through 0.09 watt/$cm^2$, during an etching process in accordance with the principles of the invention, the thermal load on the etched crystal is kept very low so that the occurring radiation damage is minimal.

In comparison with known etching techniques, the inventive etching method is advantageous in that it can be executed in a single stage process step without changing etching conditions or parameters during the plasma etch. Further, with the inventive etching method, a plate reactor can be fully loaded as long as optimum process parameters are observed.

In a presently preferred exemplary embodiment of the invention, the following parameters are utilized: a plate spacing of the electrodes is adjusted to 20±5 mm, and with an electrode diameter of 60 cm, the HF power is adjusted to 200 watts; the gas flow, Q, is adjusted to a ratio of 2:1 (i.e., 25 ccm/min of $SF_6$ and 50 ccm/min of He); the gas pressure is adjusted to 70 through 75 Pa; and the electrode temperature is adjusted to 30° through 40° C.

BRIEF DESCRIPTION OF THE DRAWINGS

FIGS. 2 and 3 are graphical illustrations, respectively showing the etching rate and selectivities as a function of HF power (FIG. 2) and as a function of gas pressure, p, (FIG. 3)

DESCRIPTION OF THE PREFERRED EMBODIMENTS

Figure 1:
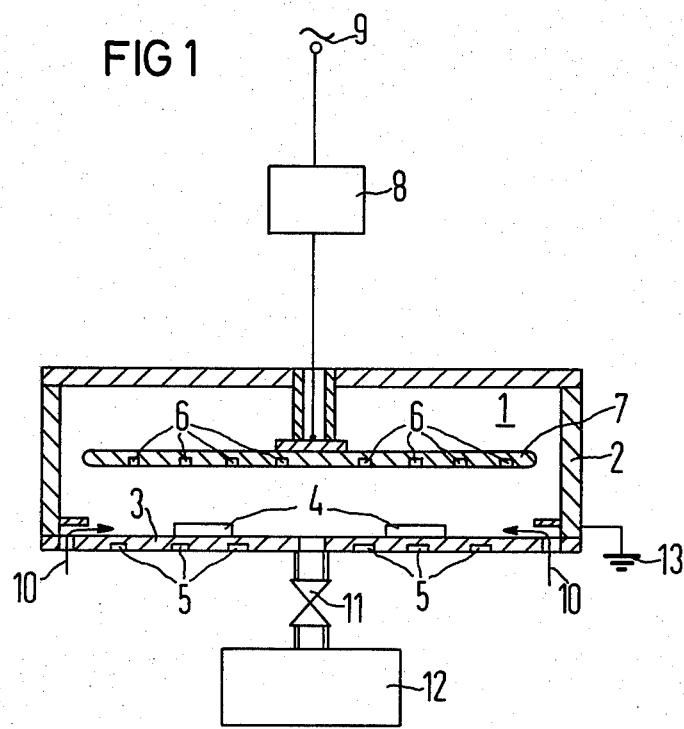
FIG. 1 is an elevated schematic view of a plate reactor having a rotationally-symmetrical system with thermostat-controlled aluminum electrodes useful for practicing the principles of the invention.

As shown in FIG. 1, a reactor 1 is comprised of a housing 2 composed, for example, of aluminum and includes a bottom plate 3 also composed of aluminum, which is utilized as a bottom electrode for crystal wafers 4. This bottom electrode 3 is provided with a fluid conduit system 5 which is interconnected to a source of heat-exchange fluid (not shown), such as water, for adjusting and controlling the electrode temperature. A similar conduit system 6 is also provided in an upper aluminum electrode 7 which is spaced opposite from electrode 3 at a distance of about 20 mm. Electrode 7 is also connected via a balancing circuit 8 to a high frequency generator 9 of 13.56 MHz. Gas inlets 10 are provided along outer edge areas of bottom electrode 3 and are connected to a controllable source of reactive gas (not shown), for example consisting of $SF_6$ and He. Gaseous reaction products are removed from the reactor 1 via a choke valve 11 for automatic pressure regulation by a rotary pump 12. The bottom plate electrode 3, on which substrates 4 containing surfaces to be etched are positioned, is suitable grounded, as at 13. Preferably, the plate reactor includes a rotationally-symmetrical system with thermostat-controlled aluminum electrodes.

In FIG. 2, the etching rate or selectivity is entered along the ordinate in nm/min and the HF power, P, is entered along the abscisca in watts. Curve I illustrates the dependency of the etching rate on the HF power for a photosensitive resist (for example, AZ 1350, commercially available from Shipley); curve II illustrates the same relation for polysilicon and curve III illustrates the relation for $SiO_2$ with the use of $SF_6$ and He as the reactive gas. Curve IV illustrates the selectivity of polysilicon: $SiO_2$ and curve V illustrates the selectivity of polysilicon: photosensitive resist (AZ 1350).

In FIG. 3, the gas pressure, p, is entered along the abscisca in Pa units, and the etching rate and selectivity are entered along the ordinate in nm/min. Curve VI illustrates the dependency of the etching rate on gas pressure, p, for polysilicon, curve VII shows the same relation for $SiO_2$ and curve VIII represents the selectivity.

As can be derived from the curves of FIGS. 2 and 3, the selectivity of polysilicon to $SiO_2$ is greater than 100:1 and the selectivity of polysilicon to photosensitive resist is greater than 40:1 when a HF power of 200 watts (See FIG. 2) and a gas pressure of 70–75 Pa (see FIG. 3) are provided. In a working embodiment, the reactive gas flow, Q, was kept at about 25 ccm/min of $SF_6$ and 50 ccm/min of helium; the plate spacing was adjusted to about 20±5 mm, the temperature of the upper electrode was adjusted to 40° to 45° C. and the temperature of the lower electrode was adjusted to about 30° C.

Figure 4:
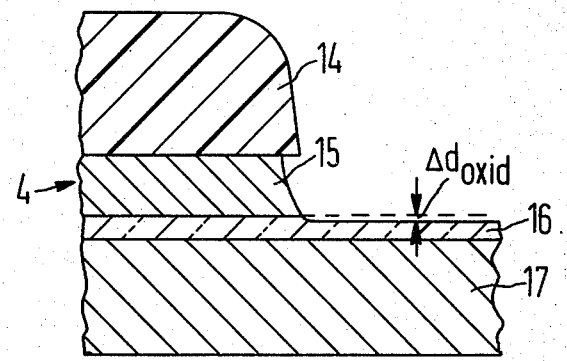
FIG. 4 is an elevated, enlarged partial cross-sectional view of a three layer semiconductor structure, photosensitive resist-polysilicon $SiO_2$-silicon crystal, etched in accordance with the principles of the invention.

The unusually high values of selectivity for etching these materials guarantees a very low oxide erosion $\Delta d_{oxid}$, of the very thin (40 nm thick) $SiO_2$ layer 16, of less than about 2 nm, under a polysilicon layer 15, as schematically shown in FIG. 4. Further, these unusually high selectivity values guarantee a good dimensional accuracy of the resist structure or mask 14, even with very oblique edges. The basic body of the integrated semiconductor circuit is composed of silicon and is designated with reference numeral 17.

Because of the potential relationships existing in a plasma provided in accordance with the principles of the invention, the etching process is a mixed isotropicanisotropic reaction. For a 500 nm thick p-doped polysilicon layer, such as layer 15 in FIG. 4, an undercutting per edge is at 150 nm. With a crystal wafer having a 100 mm diameter, the undercutting per edge fluctuates by less than ±0.1 μm. This homogeneity of the etching reaction throughout the entire reactor (loaded with a maximum of 19 crystal wafers) is relatively excellent (fluctuations are less than 3%) and has a very positive effect on electrical properties of VLSI components which were produced with this method.

Control of the etching process is possible via the etching time period (approximately 9 minutes for 500 nm polysilicon with full batching) or via intensity change of an emission line of the plasma.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not be construed or interpreted as being restrictive or otherwise limiting of the present invention, excepting as it is set forth and defined in the hereto-appended claims.

We claim as our invention:

1. In a method of producing polysilicon structures down to a 1 μm range on substrates containing integrated semiconductor circuits by plasma etching in a plate reactor with a reactive gas mixture composed of $SF_6$ and an inert gas wherein a substrate to be etched is provided with a 3-layered structure defined by a layer of silicon dioxide positioned directly on said substrate, a layer of polysilicon positioned on said silicon dioxide layer and a resist mask positioned on said polysilicon layer, and said substrate is positioned on a grounded electrode, the improvement comprising:

adjusting the high frequency power for the plate reactor to values smaller than 0.1 watts/cm$^2$;

adjusting the gas pressure of the reactive gas mixture in the reactor to values in the range from 60 through 120 Pa;

adjusting the temperature of the electrode in the plate reactor to values in the range from 20° through 60° C.; and etching said substrate while maintaining the above conditions for a period of time sufficient to attain desired polysilicon structures.

2. In a method as defined in claim 1 wherein the high frequency power is adjusted to a value in the range from 0.3 through 0.9 watts/cm$^2$.

3. In a method as defined in claim 1 wherein the reactive gas mixture is composed of $SF_6$ and He and the gas flow of He:$SF_6$ is adjusted to values smaller than 5:1.

4. In a method as defined in claim 1 wherein the plate spacing of the electrode in the plate reactor is adjusted to about 20±5 mm.

5. In a method as defined in claim 1 wherein, with an electrode diameter of 60 cm, the high frequency power of the reactor is adjusted to 200 watts, the reactive gas is composed of $SF_6$ and He and the gas flow through the reactor is adjusted to a ratio of 2:1; the gas pressure within the reactor is adjusted to value ranging from 70 through 75 Pa, the plate spacing of the electrodes in the reactor is adjusted to 20 mm and the temperature of the electrode is adjusted to a value ranging from 30° through 40° C.

6. In a method as defined in claim 1 wherein said plate reactor includes a rotationally-symmetrical system with thermostat-controlled aluminum electrodes.

* * * * *